US008559588B2

(12) United States Patent
Kikuchi et al.

(10) Patent No.: US 8,559,588 B2
(45) Date of Patent: Oct. 15, 2013

(54) SHIFT REGISTER

(75) Inventors: Tetsuo Kikuchi, Osaka (JP); Shinya Tanaka, Osaka (JP); Chikao Yamasaki, Osaka (JP); Junya Shimada, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 46 days.

(21) Appl. No.: 13/264,828

(22) PCT Filed: Dec. 25, 2009

(86) PCT No.: PCT/JP2009/071617
§ 371 (c)(1),
(2), (4) Date: Oct. 17, 2011

(87) PCT Pub. No.: WO2010/137197
PCT Pub. Date: Dec. 2, 2010

(65) Prior Publication Data
US 2012/0032615 A1 Feb. 9, 2012

(30) Foreign Application Priority Data
May 28, 2009 (JP) .................... 2009-128445

(51) Int. Cl.
*G11C 19/00* (2006.01)
(52) U.S. Cl.
USPC ............. 377/64; 377/68; 377/78; 377/79
(58) Field of Classification Search
None
See application file for complete search history.

(56) References Cited

U.S. PATENT DOCUMENTS

| 5,222,082 A | 6/1993 | Plus |
| 5,434,899 A | 7/1995 | Huq et al. |
| RE40,673 E * | 3/2009 | Kanbara et al. ............. 345/100 |
| 7,652,653 B2 * | 1/2010 | Nakao et al. ............... 345/100 |
| 8,085,235 B2 * | 12/2011 | Jeon et al. ................. 345/100 |
| 2005/0008114 A1 | 1/2005 | Moon |
| 2006/0220587 A1 | 10/2006 | Tobita et al. |
| 2008/0002805 A1 | 1/2008 | Tobita et al. |
| 2008/0187089 A1 | 8/2008 | Miyayama et al. |
| 2009/0251443 A1 * | 10/2009 | Jinta ........................ 345/204 |
| 2010/0246750 A1 * | 9/2010 | Kimura et al. ............. 377/64 |
| 2011/0164854 A1 * | 7/2011 | Desard et al. ............. 385/135 |
| 2011/0216874 A1 * | 9/2011 | Toyotaka ................. 377/75 |
| 2011/0216876 A1 * | 9/2011 | Amano et al. ............. 377/75 |

FOREIGN PATENT DOCUMENTS

| JO | 0887897 A | 4/1996 |
| JP | 0964375 A | 3/1997 |

(Continued)

OTHER PUBLICATIONS

International Search Report for International Application No. PCT/JP2009/071617 filed Dec. 25, 2009.

*Primary Examiner* — Tuan T Lam
(74) *Attorney, Agent, or Firm* — Harness, Dickey & Pierce

(57) ABSTRACT

Provided is a shift register configured by cascade connecting unit circuits each including a bootstrap circuit. In at least one example embodiment, for the unit circuits, a time period during which a transistor is in an ON state and a clock signal is high level corresponds to a clock passing period. Among transistors whose one conduction terminal is connected to a gate of the transistor, channel lengths of transistors configured such that a low-level potential is fed to gates of the transistors to turn the transistors to an OFF state in the clock passing period and that a low-level potential is applied to the conduction terminal of the transistors in the clock passing period are made longer than the channel length of the transistor. With this, it is possible to reduce a leakage current in the clock passing period, and to prevent the fluctuation of a gate potential of the transistor and dullness in an output signal from occurring.

16 Claims, 15 Drawing Sheets

(56) References Cited

FOREIGN PATENT DOCUMENTS

| | | | |
|---|---|---|---|
| JP | 2005050502 A | 2/2005 |
| JP | 2006277860 A | 10/2006 |
| JP | 2008140489 A | 6/2008 |
| JP | 2008140490 A | 6/2008 |
| JP | 2008193545 A | 8/2008 |
| JP | 2009252269 A | 10/2009 |
| WO | WO-9215992 A1 | 9/1992 |

* cited by examiner

Conventional Art

Conventional Art

SHIFT REGISTER

TECHNICAL FIELD

The present invention relates to shift registers and, in particular, to a shift register suitably used, for example, in a drive circuit for a display device.

BACKGROUND ART

An active matrix-type display device displays an image by selecting pixel circuits by row out of pixel circuits that are arranged two-dimensionally, and writing voltages according to display data in the selected pixel circuits. In order to select pixel circuits by row, a shift register that sequentially shifts an output signal based on a clock signal is used as a scanning signal line drive circuit. For a display device performing dot sequential driving, a shift register of the same type is provided within a data signal line drive circuit.

Further, for a liquid crystal display device and the like, a scanning signal line drive circuit is often formed integrally with a pixel circuit using a manufacturing process for forming a TFT (Thin Film Transistor) in a pixel circuit. In such a case, it is preferable that, in order to reduce manufacturing costs, a shift register which functions as the scanning signal line drive circuit be formed with transistors of the same conductivity type as the TFT (specifically, an N-channel type transistor).

A shift register configured with N-channel type transistors utilizes a bootstrap circuit shown in FIG. 18 in order to output a clock signal at an unchanged voltage level. In the circuit shown in FIG. 18, when an input signal IN changes from low level to high level, a potential of a node N9 also changes to high level via a diode connected transistor 92, turning a transistor 91 to an ON state. Then, when the input signal IN changes to low level, the transistor 92 is turned to an OFF state and the node N9 becomes in a floating state, but the transistor 91 keeps the ON state.

When a clock signal CK changes from low level to high level in this condition, the potential of the node N9 increases up to about (2×Vck) (where Vck is amplitude of the clock signal CK) due to an effect of a capacitor 93 which exists between a gate and a source of the transistor 91 (bootstrap effect). Therefore, the clock signal CK having the amplitude Vck passes the transistor 91 without causing a voltage drop, and the clock signal CK is outputted from an output terminal OUT at the unchanged voltage level.

A shift register including a bootstrap circuit is described in Patent Documents 1 to 3, for example.

PRIOR ART DOCUMENTS

Patent Documents

[Patent Document 1] Japanese Laid-Open Patent Publication No. 2005-50502
[Patent Document 2] International Publication Pamphlet No. WO 92/15992
[Patent Document 3] Japanese Laid-Open Patent Publication No. H8-87897

SUMMARY OF THE INVENTION

Problems to be Solved by the Invention

The conventional shift register as described above poses a problem that an output signal becomes dull as a gate potential of an output transistor fluctuates due to a leakage current. The circuit shown in FIG. 18 is provided with a transistor 94 between the node N9 and the ground in order to change the potential of the node N9 to low level after outputting the clock signal CK (see FIG. 19). During a period in which the potential of the node N9 is Vck or higher, the transistor 94 is controlled to be in the OFF state using a control signal CTRL.

However, during a period in which a potential difference (2×Vck) is applied between a drain and a source of the transistor 94, a leakage current that is larger than usual flows through the transistor 94. Therefore, the potential of the node N9 decreases from (2×Vck) with the passage of time, and dullness occurs in the output signal OUT (see FIG. 20).

For example, some of amorphous silicon TFT liquid crystal panels are required to have a high-level potential of a scanning signal line which is higher than that of common TN (Twisted Nematic) mode liquid crystal panels. In a case in which a scanning signal line drive circuit is integrally formed in such a liquid crystal panel, a high voltage over 40 V may be applied between a drain and a source of a transistor in a shift register. An output signal is susceptible to dullness when such a high high-level potential is required. Further, dullness in an output signal can also occur easily when temperature is high. Dullness in an output signal of a shift register possibly causes a display device and the like including the shift register to operate incorrectly.

Thus, an object of the present invention is to provide a shift register capable of preventing dullness in an output signal from occurring.

Means for Solving the Problems

According to a first aspect of the present invention, there is provided a shift register including: unit circuits in cascade connection, wherein each unit circuit includes: an output transistor provided between a clock terminal and an output terminal, and configured to switch between passing and blocking of a clock signal according to a gate potential; and one or more control transistors, one conduction terminal of each transistor being connected to a gate of the output transistor, each unit circuit is configured such that during a clock passing period in which the output transistor is in an ON state and the clock signal is high level, a gate potential of the output transistor is higher than a high-level potential of the clock signal, and the control transistors include a transistor whose channel length is longer than that of the output transistor.

According to a second aspect of the present invention, in the first aspect of the present invention, the control transistors include a transistor configured such that a low-level potential is fed to a gate of the transistor to turn the transistor to an OFF state in the clock passing period and that a low-level potential is applied to the other conduction terminal of the transistor in the clock passing period, and the channel length of the corresponding transistor is longer than that of the output transistor.

According to a third aspect of the present invention, in the second aspect of the present invention, the control transistors include a transistor configured such that a low-level potential is fed to a gate of the transistor to turn the transistor to an OFF state in the clock passing period and that a low-level potential is fixedly applied to the other conduction terminal of the transistor, and the channel length of the corresponding transistor is longer than that of the output transistor.

According to a fourth aspect of the present invention, in the second aspect of the present invention, the control transistors include a transistor configured such that a low-level potential is fed to a gate of the transistor to turn the transistor to an OFF state in the clock passing period and that a signal that becomes low level in the clock passing period is fed to the other conduction terminal of the transistor, and the channel length of the corresponding transistor is longer than that of the output transistor.

According to a fifth aspect of the present invention, in the second aspect of the present invention, the control transistors include a plurality of transistors configured such that a low-level potential is fed to a gate of each transistor to turn the transistor to an OFF state in the clock passing period and that a low-level potential is applied to the other conduction terminal of each transistor in the clock passing period, and the channel length of each of the plurality of transistors is longer than that of the output transistor.

According to a sixth aspect of the present invention, in the first aspect of the present invention, the control transistors include a transistor whose channel length is longer than that of the output transistor by 0.5 μm or more.

According to a seventh aspect of the present invention, in the first aspect of the present invention, the gate of the output transistor is capacitively coupled with a conduction terminal of the output transistor on a side of the output terminal.

According to an eighth aspect of the present invention, there is provided a display device including: a plurality of pixel circuits arranged two-dimensionally; and a drive circuit including a shift register according to one of the first to seventh aspects of the present invention.

Effects of the Invention

According to the first aspect of the present invention, by increasing the channel length of the control transistor connected to the gate of the output transistor, it is possible to reduce a leakage current flowing through the control transistor in the clock passing period, and to prevent fluctuation of the gate potential of the output transistor. With this, it is possible to prevent dullness in the output signal from occurring.

According to the second aspect of the present invention, in a case where the transistor is connected to the gate of the output transistor, the transistor being configured such that the low-level potential is fed to the gate of the transistor to turn the transistor to the OFF state in the clock passing period and the low-level potential is applied to the other conduction terminal, by increasing the channel length of the transistor in the clock passing period, it is possible to reduce a leakage current flowing through the transistor in the clock passing period, and to prevent fluctuation of the gate potential of the output transistor and to prevent dullness in the output signal from occurring.

According to the third aspect of the present invention, in the case where the transistor is connected to the gate of the output transistor, the transistor being configured such that the low-level potential is fed to the gate of the transistor to turn the transistor to the OFF state in the clock passing period and the low-level potential is fixedly applied to the other conduction terminal, by increasing the channel length of the transistor, it is possible to reduce a leakage current flowing through the transistor in the clock passing period, and to prevent fluctuation of the gate potential of the output transistor and to prevent dullness in the output signal from occurring.

According to the fourth aspect of the present invention, in the case where the transistor is connected to the gate of the output transistor, the transistor being configured such that the low-level potential is fed to the gate of the transistor to turn the transistor to the OFF state in the clock passing period and the signal that becomes low level in the clock passing period is fed to the other conduction terminal, by increasing the channel length of the transistor, it is possible to reduce a leakage current flowing through the transistor in the clock passing period, and to prevent fluctuation of the gate potential of the output transistor and to prevent dullness in the output signal from occurring.

According to the fifth aspect of the present invention, in the case where the plurality of transistors are connected to the gate of the output transistor, each transistor being configured such that the low-level potential is fed to the gate of the transistor to turn the transistor to the OFF state in the clock passing period and the low-level potential is applied to the other conduction terminal in the clock passing period, by increasing the channel length of each of the plurality of transistors, it is possible to reduce a leakage current flowing through the corresponding transistor in the clock passing period, and to prevent fluctuation of the gate potential of the output transistor and to prevent dullness in the output signal from occurring effectively.

According to the sixth aspect of the present invention, by making the channel length of the control transistor connected to the gate of the output transistor longer than the channel length of the output transistor by 0.5 μm or more, it is possible to provide an advantageous effect that, even when there is a process variation in the channel length of the transistor on the order of ±0.2 μm, it is possible to prevent fluctuation of the gate potential of the output transistor and to prevent dullness in the output signal from occurring.

According to the seventh aspect of the present invention, by capacitively coupling the gate of the output transistor with the conduction terminal of the output transistor on the side of the output terminal, it is possible to easily configure a unit circuit in which the gate potential of the output transistor is higher than the high-level potential of the clock signal in the clock passing period.

According to the eighth aspect of the present invention, by using the drive circuit including the shift register capable of preventing dullness in the output signal from occurring, it is possible to prevent the display device from operating incorrectly.

MODE FOR CARRYING OUT THE INVENTION

In the following, a shift register according to each embodiment of the present invention is described with reference to drawings. In the following description, a high-level potential is Vck, and a low-level potential is 0, unless otherwise stated. In addition, a signal that is inputted or outputted through one terminal of a circuit is referred by the name of the concerned terminal (a signal inputted through a clock terminal CK is referred to as a clock signal CK, for example). Further, n and m are integers not smaller than 2, is an integer not smaller than 1 and not greater than n, and j is an integer not smaller than 1 and not greater than m.

First Embodiment

Figure 1:
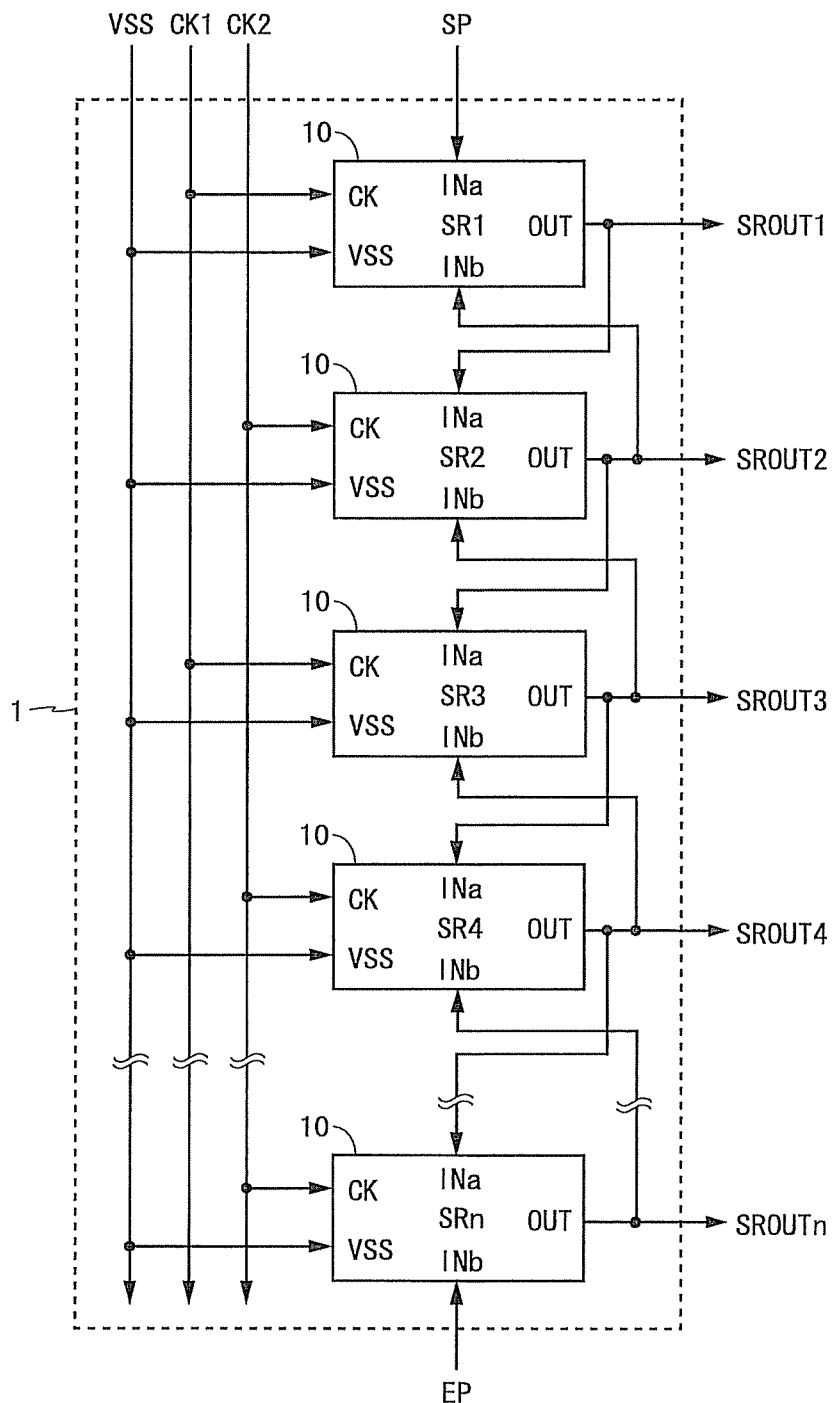
FIG. 1 is a block diagram illustrating a structure of a shift register according to a first embodiment of the present invention.

FIG. 1 is a block diagram illustrating a structure of a shift register according to a first embodiment of the present invention. A shift register 1 shown in FIG. 1 is configured by cascade connecting n unit circuits 10. Each unit circuit 10 has input terminals INa and INb, a clock terminal CK, a power source terminal VSS, and an output terminal OUT.

To the shift register 1, a start pulse SP, an end pulse EP, clock signals CK1 and CK2 of two phases, and a low-level potential VSS are externally supplied. The start pulse SP is fed to the input terminal INa of a first stage unit circuit 10. The end pulse EP is fed to the input terminal INb of an n-th stage unit circuit 10. The clock signal CK1 is fed to the clock terminals CK of odd-numbered stage unit circuits 10. The clock signal CK2 is fed to the clock terminals CK of even-numbered stage unit circuits 10. The low-level potential VSS is fed to the power source terminals VSS of all of the unit circuits 10. An output signal OUT from the unit circuit 10 is externally outputted as output signals SROUT1 to SROUTn, and fed to the input terminal INa of a next stage unit circuit 10 and to the input terminal INb of a previous stage unit circuit 10.

Figure 2:
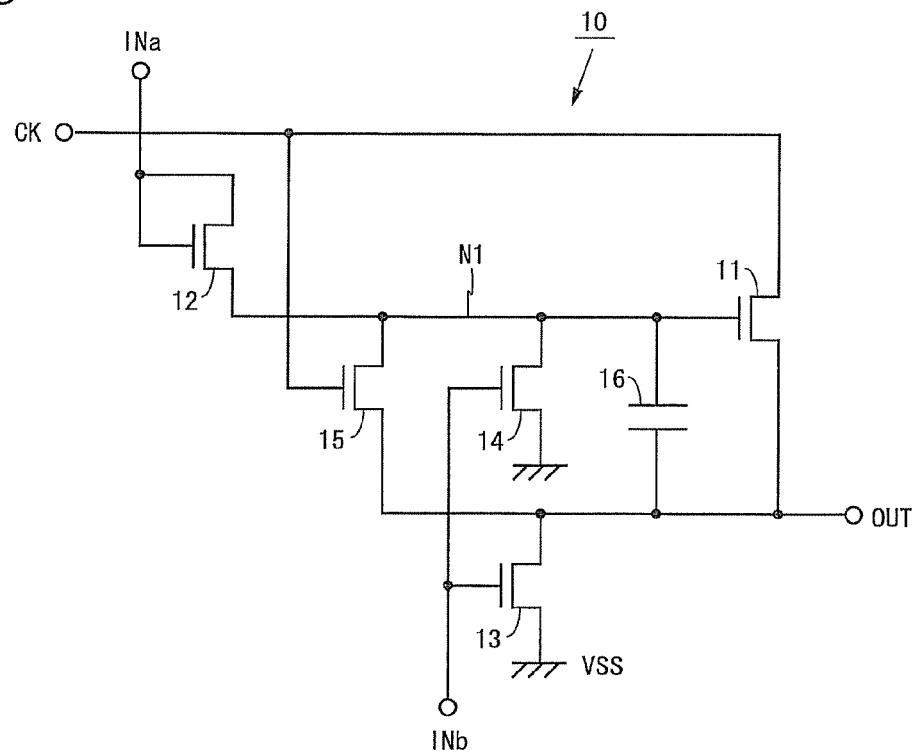
FIG. 2 is a circuit diagram of a unit circuit included in the shift register shown in FIG. 1.

FIG. 2 is a circuit diagram of the unit circuit 10 included in the shift register 1. A circuit structure of the unit circuit 10 is the same as that described in Patent Document 1. The unit circuit 10 is different from the circuit described in Patent Document 1 in that the unit circuit 10 has a characteristic in sizes of transistors as described later.

As shown in FIG. 2, each unit circuit 10 includes N-channel type transistors 11 to 15 and a capacitor 16. A drain of the transistor 11 is connected to the clock terminal CK, and a source of the transistor 11 is connected to the output terminal OUT. A drain and a gate of the transistor 12 are connected to the input terminal INa, and a source of the transistor 12 is connected to a gate of the transistor 11. The capacitor 16 is provided between the gate and the source of the transistor 11. A drain of the transistor 13 is connected to the output terminal OUT, and a drain of the transistor 14 is connected to the gate of the transistor 11. Gates of the transistors 13 and 14 are connected to the input terminal INb, and sources of the transistors 13 and 14 are connected to the power source terminal VSS. A drain of the transistor 15 is connected to the gate of the transistor 11, a gate of the transistor 15 is connected to the clock terminal CK, and a source of the transistor 15 is connected to the output terminal OUT.

The transistor 11 is provided between the clock terminal and the output terminal, and functions as an output transistor configured to switch between passing and blocking of a clock signal according to a gate potential. Further, the gate of the transistor 11 is capacitively coupled with a conduction terminal of the transistor 11 on a side of the output terminal OUT (the source). Therefore, as will be described later, in a time period during which the transistor 11 is in an ON state and the clock signal CK is high level (hereinafter referred to as a clock passing period), the gate potential of the transistor 11 becomes higher than a high-level potential of the clock signal CK. Hereinafter, a node to which the gate of the transistor 11 is connected is referred to as N1.

Figure 3:
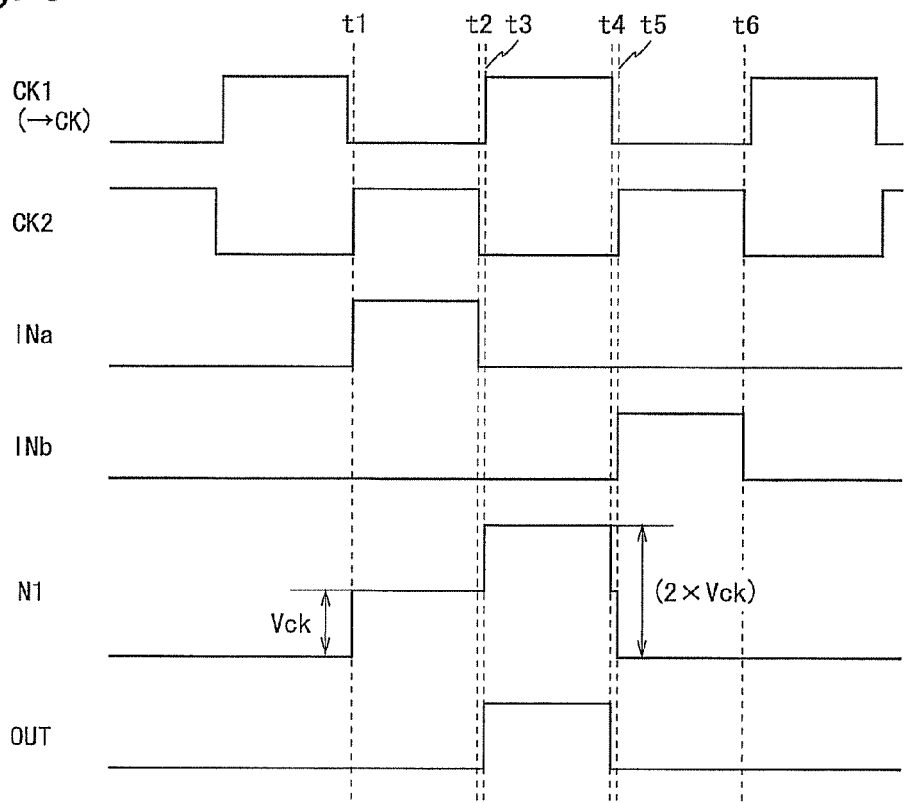
FIG. 3 is a timing chart of the shift register shown in FIG. 1.

FIG. 3 is a timing chart of the shift register 1. FIG. 3 shows changes of input signals, output signals and a potential of the node N1 of an odd-numbered stage unit circuit 10. To the odd-numbered stage unit circuit 10, the clock signal CK1 is fed through the clock terminal CK. The clock signal CK1 is a clock signal whose length in a high level period is slightly shorter than ½ cycle. The clock signal CK2 is a clock signal that is delayed by the ½ cycle from the clock signal CK1. The start pulse SP (not depicted) is at a high level before a shift operation starts for a time period of the same length as the high level period of the clock signal CK1. The end pulse EP (not depicted) is at a high level after the shift operation ends for a time period of the same length as the high level period of the clock signal CK1.

At time t1, when an input signal INa (an output signal from the previous stage unit circuit 10) changes from low level to high level, the potential of the node N1 also changes to high level via the transistor 12 that is diode connected, turning the transistor 11 to the ON state. At time t2, when the input signal INa changes to low level, the transistor 12 is turned to an OFF state and the node N1 becomes in a floating state, but the transistor 11 keeps the ON state.

At time t3, when the clock signal CK (the clock signal CK1) changes from low level to high level, the potential of the node N1 increases up to about (2×Vck) due to a bootstrap effect. As the gate potential of the transistor 11 is sufficiently high, the clock signal CK passes through the transistor 11 without causing a voltage drop. In a time period from the time t3 to time t4 during which the clock signal CK is high level, the potential of the node N1 is about (2×Vck), and the output signal OUT becomes high level. At the time t4, the potential of the node N1 becomes high level, and the output signal OUT becomes low level.

At time t5, when an input signal INb (an output signal from the next stage unit circuit 10) changes from low level to high level, the transistors 13 and 14 are turned to the ON state. While the transistor 13 is in the ON state, a low-level potential is applied to the output terminal OUT. Further, when the transistor 14 is turned to the ON state, the potential of the node N1 changes to low level and the transistor 11 is turned to the OFF state.

At time t6, when the input signal INb changes to low level, the transistors 13 and 14 are turned to the OFF state. At this time, the node N1 becomes in the floating state, but the transistor 11 keeps the OFF state. Until the input signal INa becomes high level next time, the transistor 11 keeps the OFF state and the output signal OUT remains at low level.

The transistor 15 is turned to the ON state when the clock signal CK is high level. Therefore, every time when the clock signal CK becomes high level while the output signal OUT is low level, a potential of the output terminal OUT (low-level potential) is applied to the node N1. As described above, the transistor 15 has a function of preventing fluctuation of the potential of the node N1.

Figure 4:
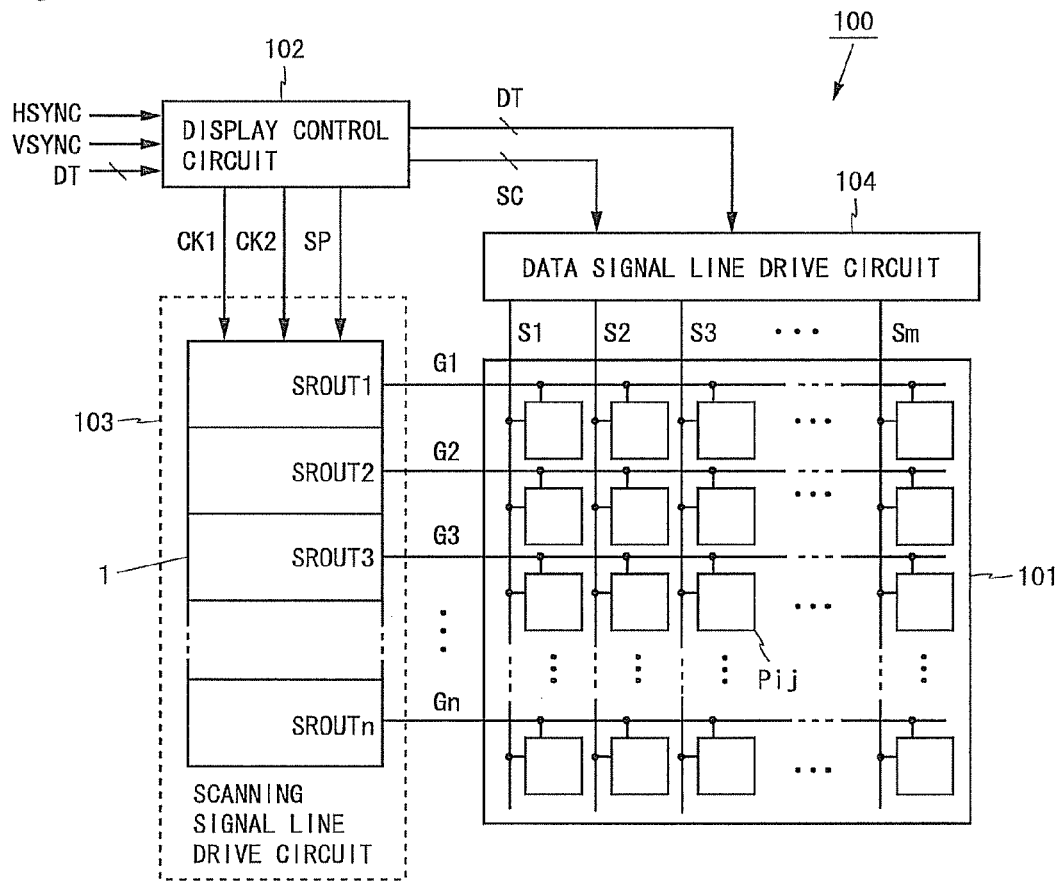
FIG. 4 is a block diagram illustrating a structure of a liquid crystal display device including the shift register shown in FIG. 1.

The shift register 1 is used, for example, in a drive circuit for a display device. FIG. 4 is a block diagram illustrating a structure of a liquid crystal display device including the shift register 1. A liquid crystal display device 100 shown in FIG. 4 includes a pixel array 101, a display control circuit 102, a scanning signal line drive circuit 103, and a data signal line drive circuit 104. In the liquid crystal display device 100, the shift register 1 is used as the scanning signal line drive circuit 103.

The pixel array 101 shown in FIG. 4 includes n scanning signal lines G1 to Gn, m data signal lines S1 to Sm, and (m×n) pixel circuits Pij. The scanning signal lines G1 to Gn are disposed in parallel with each other, and the data signal lines S1 to Sm are disposed in parallel with each other so as to intersect with the scanning signal lines G1 to Gn perpendicularly. Each of the pixel circuits Pij is disposed near an intersection between the scanning signal line Gi and the data signal line Sj. In this manner, the (m×n) pixel circuits Pij are arranged two-dimensionally such that m circuits are aligned in each row and n circuits are aligned in each column. The scanning signal line Gi is connected to all of the pixel circuits Pij aligned in an i-th line, and the data signal line Sj is connected to all of the pixel circuits Pij aligned in a j-th column.

From outside of the liquid crystal display device 100, a control signal such as a horizontal synchronizing signal HSYNC or a vertical synchronizing signal VSYNC, and display data DT, are supplied. The display control circuit 102 outputs, based on these signals, the clock signals CK1 and CK2 and the start pulse SP to the scanning signal line drive circuit 103, and outputs an control signal SC and the display data DT to the data signal line drive circuit 104.

The scanning signal line drive circuit 103 is configured by an n-stage shift register 1. The shift register 1 controls, based on the clock signals CK1 and CK2, the output signals SROUT1 to SROUTn to be high level (indicating a selected state) sequentially one by one. The output signals SROUT1 to SROUTn are respectively fed to the scanning signal lines G1 to Gn. With this, the scanning signal lines G1 to Gn are selected sequentially one by one, and the pixel circuits Pij in a single row are collectively selected.

The data signal line drive circuit 104 feeds, based on the control signal SC and the display data DT, voltages according to the display data DT to the data signal lines S1 to Sm. With this, the voltages according to the display data DT are written to the selected pixel circuits Pij in a single row. In this manner, the liquid crystal display device 100 displays an image.

Next, sizes of the transistors within the unit circuit 10 are described as a characteristic of the shift register 1 according to this embodiment. The node N1 in the unit circuit 10 is connected with, in addition to the transistor 11, the transistors 12, 14, and 15. Among these, the transistors 12 and 14 are turned to the OFF state in the clock passing period as a low-level potential is fed to the gates of these transistors. Further, the input signal INa which is at low level in the clock passing period is applied to the drain of the transistor 12, and a low-level potential is fixedly applied to the source of the transistor 14. Therefore, in the unit circuit 10, in order to prevent the fluctuation of the potential of the node N1 (potential drop) due to a leakage current in the clock passing period, channel lengths (gap length between the drain and the source) of the transistors 12 and 14 are made longer than the channel length of the transistor 11.

It is provided that, for example, when channel widths W and channel lengths L for the transistors 11 to 15 are obtained according to the conventional designing method, results listed below are obtained.

Transistor 11: W/L=5000/4 μm
Transistor 12: W/L=750/4 μm
Transistor 13: W/L=1000/4 μm
Transistor 14: W/L=750/4 μm
Transistor 15: W/L=500/4 μm In this embodiment, the sizes of the transistors 11, 13, and 15 are unchanged, and the channel lengths of the transistors 12 and 14 are increased by 1.5 times. The channel widths of the transistors 12 and 14 are also increased by 1.5 times accordingly. As a result, the channel widths W and the channel lengths L for the transistors 12 and 14 are as listed below.

Transistor 12: W/L=1125/6 μm
Transistor 14: W/L=1125/6 μm

In general, an ON current Ion that flows through a transistor can be obtained by an expression (1) as listed below. Here, in the expression (1), μ is mobility, W is a channel width of the transistor, L is a channel length of the transistor, Cgi is capacitance per unit area of a gate insulation film, Vg is a gate voltage of the transistor, and Vth is a threshold voltage of the transistor.

$$Ion = \frac{1}{2} \times \mu \times (W/L) \times Cgi \times (Vg-Vth)^2 \qquad (1)$$

As shown by the expression (1), the ON current Ion is proportional to (W/L). Accordingly, increasing the channel width W by the same ratio when the channel length L of a transistor is increased allows an ON current whose amount is the same as that before the channel length is changed to flow, thereby realizing the same ON characteristic.

Figure 5:
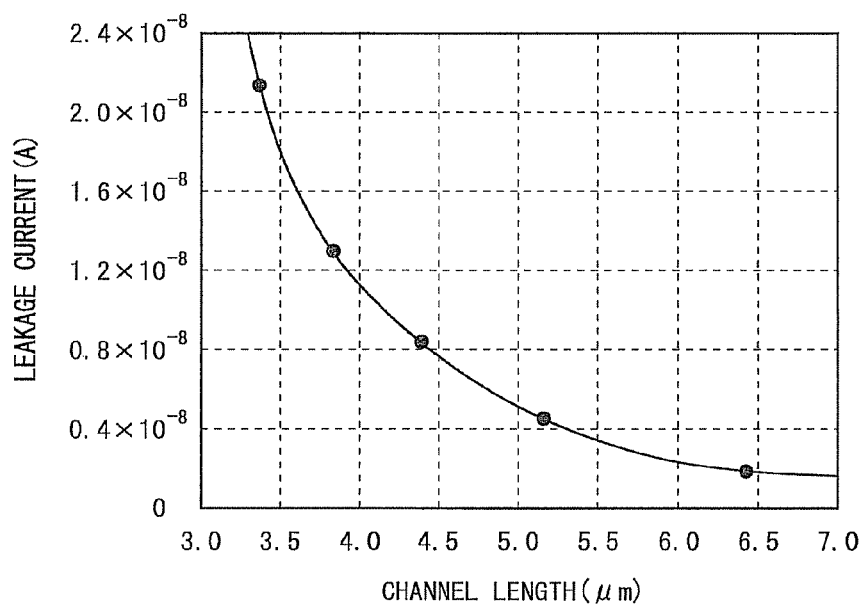
FIG. 5 is a chart showing a relation between a channel length and a leakage current of a transistor.
Figure 19:
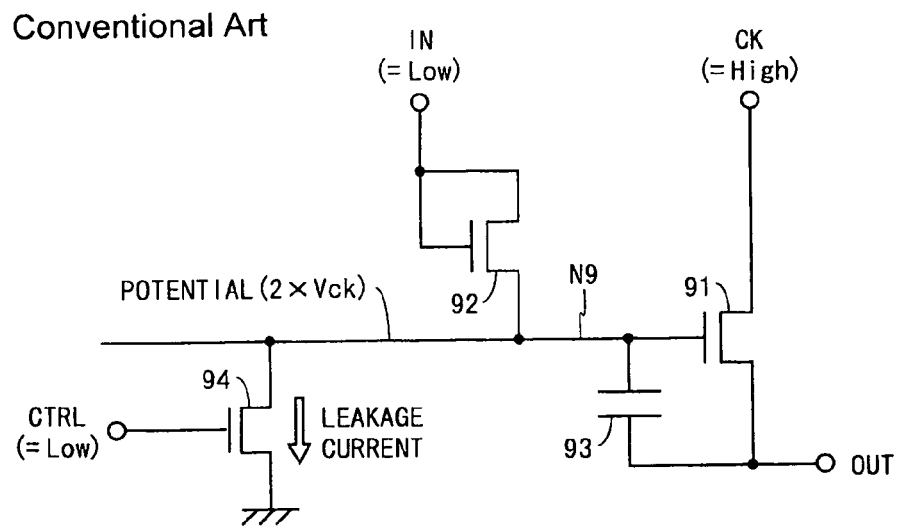
FIG. 19 is a diagram illustrating why dullness occurs in an output signal of the bootstrap circuit.
Figure 20:
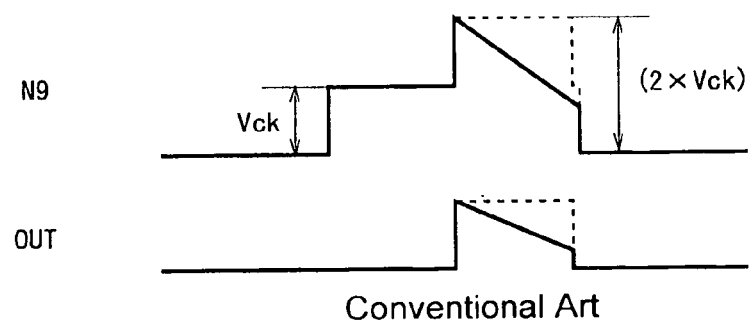
FIG. 20 is a chart illustrating how dullness occurs in the output signal of the bootstrap circuit.

Next, an effect of the shift register 1 according to this embodiment is described. As described with reference to FIG. 19 and FIG. 20, a conventional shift register including a bootstrap circuit has a problem that an output signal becomes dull as a gate potential of the output transistor fluctuates due to a leakage current. FIG. 5 is a chart showing a relation between a channel length and a leakage current of a transistor. As shown in FIG. 5, increasing the channel length decreases the leakage current. For example, if the channel length is increased from 4 μm to 6 μm, the leakage current decreases down to about ⅕. Further, as can be seen from FIG. 5, when the channel length is increased by k times (where, k>1), the leakage current becomes considerably smaller than 1/k times. Therefore, by increasing the channel width W by the same ratio when the channel length L of the transistor is increased as described above, the leakage current reduces as compared to that before the channel length is changed.

The shift register 1 according to this embodiment has a characteristic that out of the transistors 12, 14, and 15 whose one conduction terminal is connected to the gate of the transistor 11 (output transistor), the channel lengths of the transistors 12 and 14 that are turned to the OFF state by the low-level potential being fed to the gates of these transistors in the clock passing period and a low-level potential is applied to the other conduction terminals of these transistors in the clock passing period are longer than the channel length of the transistor 11. Therefore, as compared to the conventional shift register, it is possible to reduce the leakage current flowing through the transistors 12 and 14 in the clock passing period, and to prevent the fluctuation of the potential of the node N1 (gate potential of the output transistor), thereby reducing dullness in the output signal OUT. Thus, according to the shift register 1 of this embodiment, dullness in the output signal OUT can be prevented from occurring. Further, using the shift register 1, capable of preventing dullness in the output signal from occurring, as a scanning signal line drive circuit in a display device, it is possible to correctly drive the scanning signal lines, and to prevent the display device from operating incorrectly.

It should be noted that in the unit circuit 10, the potential difference (2×Vck) is not applied between the drain and the source of the transistors 11, 13, and 15. Therefore, the leakage currents flowing through the transistors 11, 13, and 15 are smaller than the leakage currents flowing through the transistors 12 and 14. Even if the channel lengths of the transistors 11, 13, and 15 are increased, this does not contribute to the prevention of dullness in the output signal OUT, and increases a size of the circuit. Thus, it is preferable that values obtained according to the conventional designing be used for the channel lengths of the transistors 11, 13, and 15.

Moreover, when increasing the channel lengths of the transistors 12 and 14, it is required to increase the channel lengths by a certain amount or more considering a process variation. For example, it is assumed that a channel length of a transistor includes a process variation on the order of ±0.2 μm at maximum. In a worst case, the channel lengths of the transistors 12 and 14 become shorter than a design value by 0.2 μm, and the channel length of the transistor 11 becomes longer than a design value by 0.2 μm. Therefore, in a case in which the process variation described above is present, the channel lengths of the transistors 12 and 14 are made longer than the channel length of the transistor 11 by 0.5 μm or more. With this, even if a channel length of a transistor includes a process variation on the order of ±0.2 μm, it is advantageously possible to prevent the fluctuation of the gate potential of the transistor 11, and dullness in the output signal from occurring.

Second Embodiment

Figure 6:
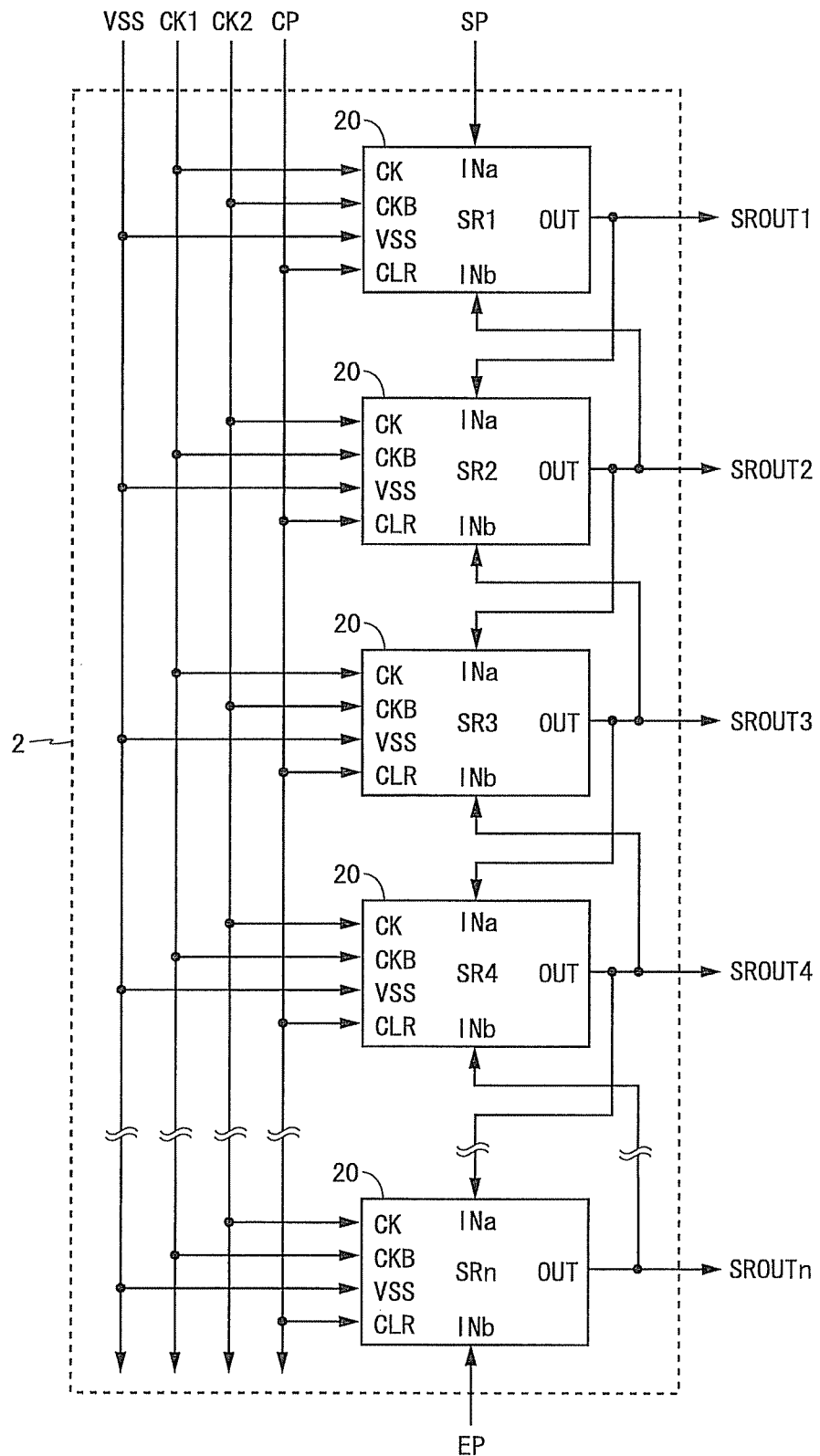
FIG. 6 is a block diagram illustrating a structure of a shift register according to a second embodiment of the present invention.

FIG. 6 is a block diagram illustrating a structure of a shift register according to a second embodiment of the present invention. A shift register 2 shown in FIG. 6 is configured by cascade connecting n unit circuits 20. Each unit circuit 20 has input terminals INa and INb, clock terminals CK and CKB, a power source terminal VSS, a clear terminal CLR, and an output terminal OUT.

To the shift register 2, a start pulse SP, an end pulse EP, clock signals CK1 and CK2 of two phases, a clear pulse CP, and a low-level potential VSS are externally supplied. The start pulse SP is fed to the input terminal INa of a first stage unit circuit 20. The end pulse EP is fed to the input terminal INb of an n-th stage unit circuit 20. The clock signal CK1 is fed to the clock terminals CK of odd-numbered stage unit circuits 20 and to the clock terminals CKB of even-numbered stage unit circuits 20. The clock signal CK2 is fed to the clock terminals CK of the even-numbered stage unit circuits 20, and to the clock terminals CKB of the odd-numbered stage unit circuits 20. The clear pulse CP is fed to the clear terminals CLR of all of the unit circuits 20. The low-level potential VSS is fed to the power source terminals VSS of all of the unit circuits 20. An output signal OUT from the unit circuit 20 is externally outputted as output signals SROUT1 to SROUTn, and fed to the input terminal INa of a next stage unit circuit 20 and to the input terminal INb of a previous stage unit circuit 20.

Figure 7:
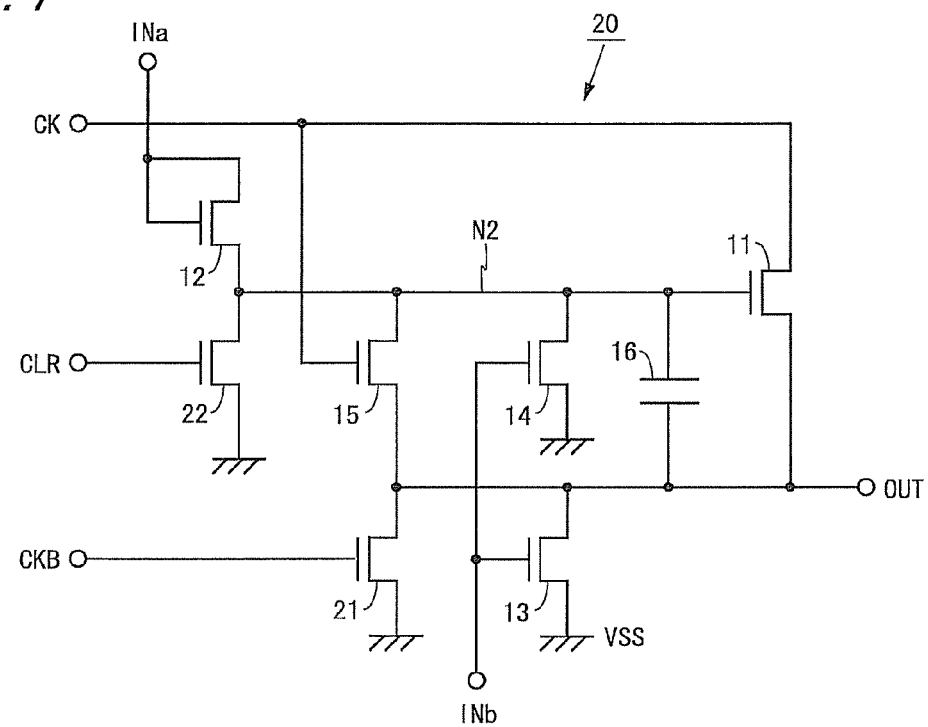
FIG. 7 is a circuit diagram of a unit circuit included in the shift register shown in FIG. 6.

FIG. 7 is a circuit diagram of the unit circuit 20 included in the shift register 2. As shown in FIG. 7, each unit circuit 20 includes N-channel type transistors 11 to 15, 21, and 22, and a capacitor 16. The unit circuit 20 is configured as the unit circuit 10 according to the first embodiment further including the transistors 21 and 22. Among the components included in the unit circuit 20, the like components as those included in the unit circuit 10 are denoted by like reference numerals and an explanation of these components is omitted.

A drain of the transistor 21 is connected to the output terminal OUT, a gate of the transistor 21 is connected to the clock terminal CKB, and a source of the transistor 21 is connected to the power source terminal VSS. A drain of the transistor 22 is connected to the gate of the transistor 11, a gate of the transistor 22 is connected to the clear terminal CLR, and a source of the transistor 22 is connected to the power source terminal VSS. Hereinafter, a node to which the gate of the transistor 11 is connected is referred to as N2.

Figure 8:
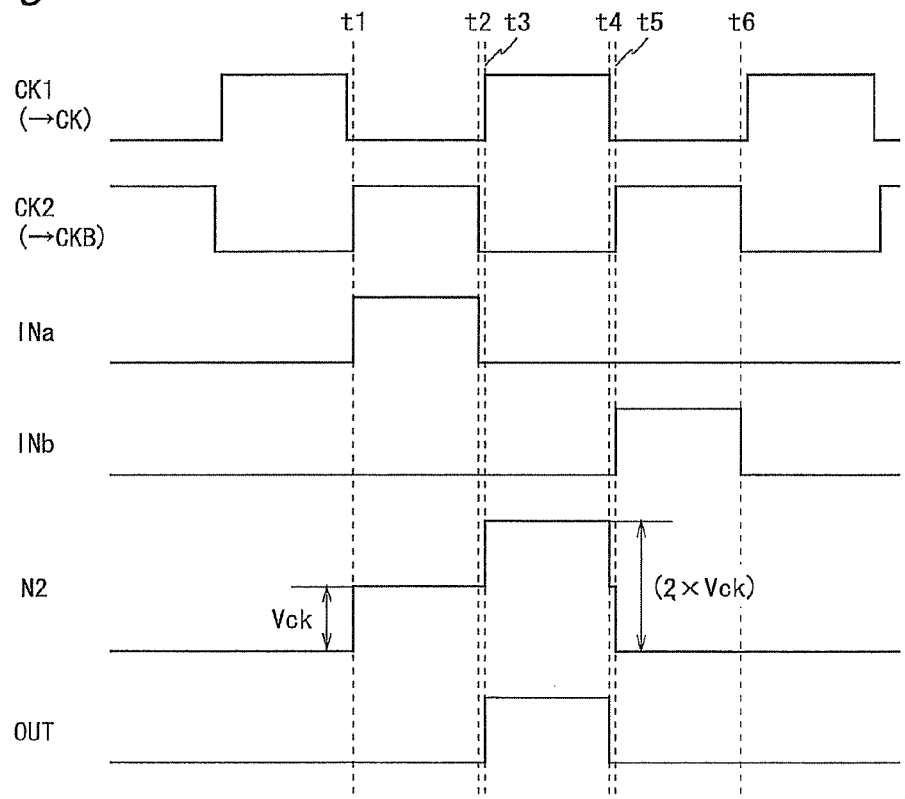
FIG. 8 is a timing chart of the shift register shown in FIG. 6.

FIG. 8 is a timing chart of the shift register 2. The timing chart shown in FIG. 8 is similar to the timing chart shown in FIG. 3. FIG. 8 shows changes of input signals, output signals and a potential of the node N2 of an odd-numbered stage unit circuit 20. To the odd-numbered stage unit circuit 20, the clock signal CK1 is fed through the clock terminal CK, and the clock signal CK2 is fed through the clock terminal CKB. The clear pulse CP (not depicted) is at a high level for a predetermined time period before a shift operation starts.

The transistor 21 is turned to the ON state when the clock signal CKB (the clock signal CK2) is high level. Therefore, every time when the clock signal CKB becomes high level, a low-level potential is applied to the output terminal OUT. As described above, the transistor 21 has a function of repeatedly setting the output signal OUT at a low level to stabilize the output signal OUT.

The transistor 22 is turned to the ON state when a clear signal CLR (the clear pulse CP) is high level. At this time, a low-level potential is applied to the node N2. As described above, the transistor 22 has a function of initializing the potential of the node N2 to a low level. The shift register 2 is used in a similar manner as the shift register 1 according to the first embodiment.

The node N2 in the unit circuit 20 is connected with, in addition to the transistor 11, the transistors 12, 14, 15, and 22. Among these, the transistors 12, 14, and 22 are turned to the OFF state in the clock passing period as a low-level potential is fed to the gates of these transistors. Further, the input signal INa which is at low level in the clock passing period is applied to the drain of the transistor 12, and a low-level potential is fixedly applied to the sources of the transistors 14 and 22. In the unit circuit 20, it is possible to prevent dullness in the output signal OUT from occurring by making the channel lengths of the transistors 12, 14, and 22 longer than the channel length of the transistor 11.

Third Embodiment

Figure 9:
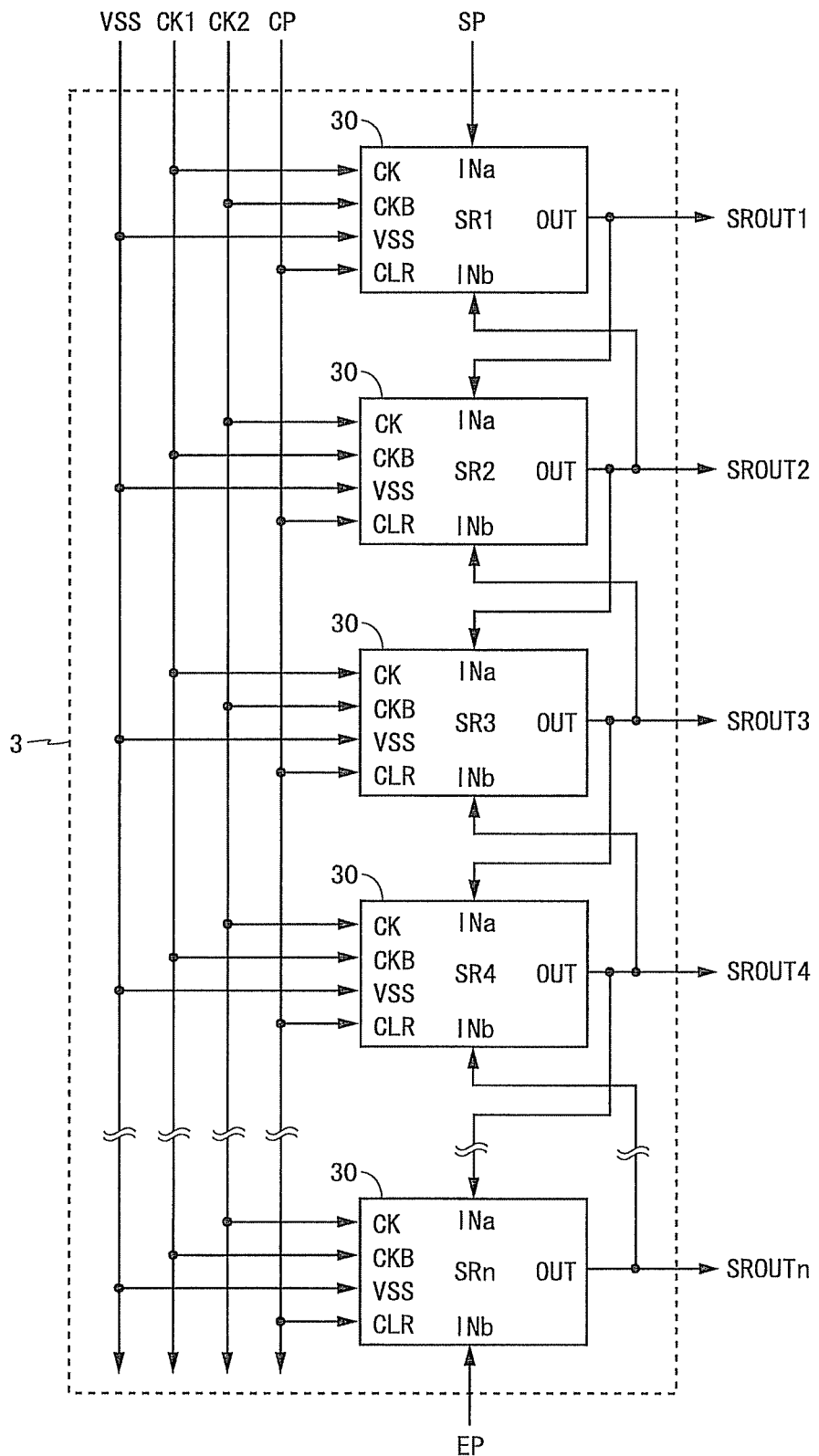
FIG. 9 is a block diagram illustrating a structure of a shift register according to a third embodiment of the present invention.

FIG. 9 is a block diagram illustrating a structure of a shift register according to a third embodiment of the present invention. A shift register 3 shown in FIG. 9 is configured by cascade connecting n unit circuits 30. Each unit circuit 30 has input terminals INa and INb, clock terminals CK and CKB, a power source terminal VSS, a clear terminal CLR, and an output terminal OUT. A connection configuration of signal lines in the unit circuit 30 of the shift register 3 is the same as that in the second embodiment.

Figure 10:
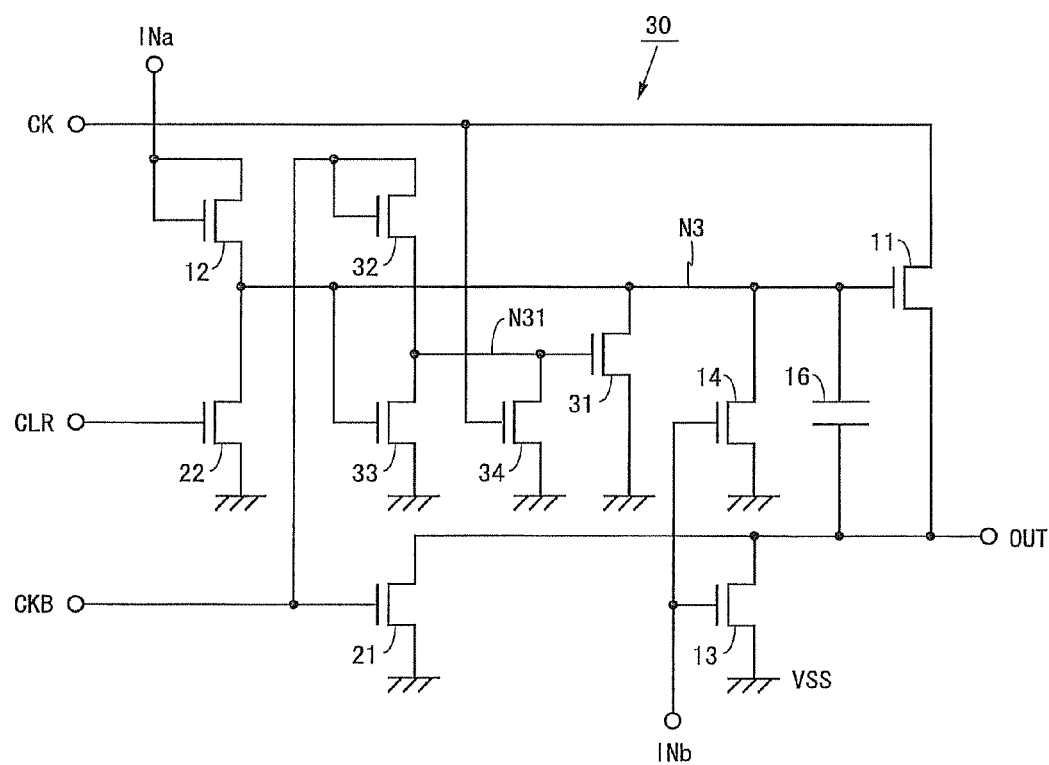
FIG. 10 is a circuit diagram of a unit circuit included in the shift register shown in FIG. 9.

FIG. 10 is a circuit diagram of the unit circuit 30 included in the shift register 3. As shown in FIG. 10, each unit circuit 30 includes N-channel type transistors 11 to 14, 21, 22, and 31 to 34, and a capacitor 16. The unit circuit 30 is configured as the unit circuit 20 according to the second embodiment excluding the transistor 15 and further including the transistors 31 to 34. Among the components included in the unit circuit 30, the like components as those included in the unit circuits 10 and 20 are denoted by like reference numerals and an explanation of these components is omitted.

A drain of the transistor 31 is connected to the gate of the transistor 21, and a source of the transistor 31 is connected to the power source terminal VSS. To a gate of the transistor 31, a source of the transistor 32 and drains of the transistors 33 and 34 are connected. A drain and a gate of the transistor 32 are connected to the clock terminal CKB. A gate of the transistor 33 is connected to the gate of the transistor 11, and a source of the transistor 33 is connected to the power source terminal VSS. A gate of the transistor 34 is connected to the clock terminal CK, and a source of the transistor 34 is connected to the power source terminal VSS. Hereinafter, a node to which the gate of the transistor 11 is connected is referred to as N3, and a node to which the gate of the transistor 31 is connected is referred to as N31.

Figure 11:
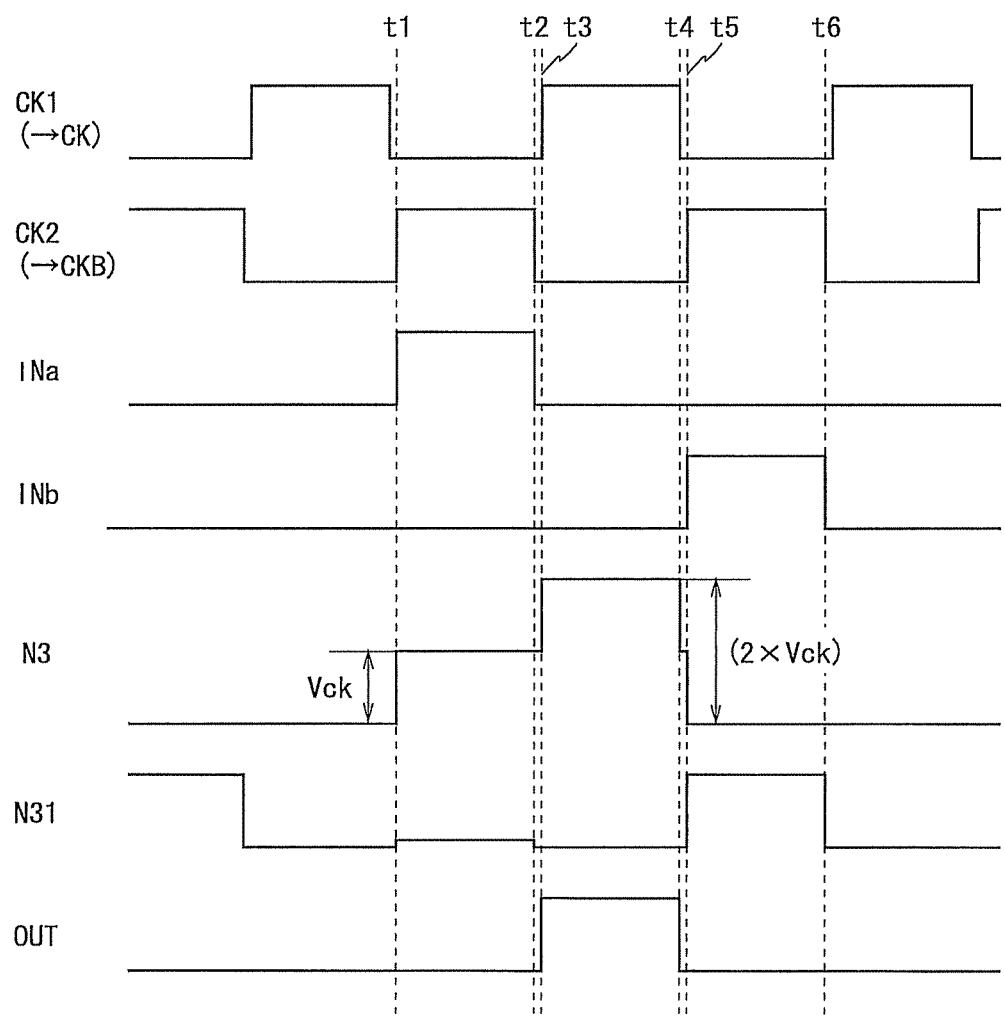
FIG. 11 is a timing chart of the shift register shown in FIG. 9.

FIG. 11 is a timing chart of the shift register 3. The timing chart shown in FIG. 11 is similar to the timing chart shown in FIG. 3. FIG. 11 shows changes of input signals, output signals and potentials of the nodes N3 and N31 of an odd-numbered stage unit circuit 30.

The transistor 32 is turned to the ON state when the clock signal CKB (the clock signal CK2) is high level. At this time, a high-level potential of the clock signal CKB is applied to the node N31. The transistor 33 is turned to the ON state when the potential of the node N3 is Vck or higher. At this time, a low-level potential is applied to the node N31. The transistor 34 is turned to the ON state when the clock signal CK (the clock signal CK1) is high level. At this time, a low-level potential is applied to the node N31.

Therefore, the potential of the node N31 becomes high level when following three conditions are satisfied: the clock signal CK is low level, the clock signal CKB is high level, and the potential of the node N3 is low level. Otherwise, the potential of the node N31 becomes low level. The transistor 31 is turned to the ON state when the potential of the node N31 is high level. At this time, a low-level potential is applied to the node N3. As described above, the transistors 31 to 34 have a function of maintaining the low-level potential applied to the potential of the node N3. The shift register 3 is used in a similar manner as the shift register 1 according to the first embodiment.

The node N3 in the unit circuit 30 is connected with, in addition to the transistor 11, the transistors 12, 14, 22, 31, and 33. Among these, the transistors 12, 14, 22, and 31 are turned to the OFF state in the clock passing period as a low-level potential is fed to the gates of these transistors. Further, the input signal INa which is at low level in the clock passing period is applied to the drain of the transistor 12, and a low-level potential is fixedly applied to the sources of the transistors 14, 22, and 31. In the unit circuit 30, it is possible to prevent dullness in the output signal OUT from occurring by making the channel lengths of the transistors 12, 14, 22, and 31 longer than the channel length of the transistor 11.

Fourth Embodiment

Figure 12:
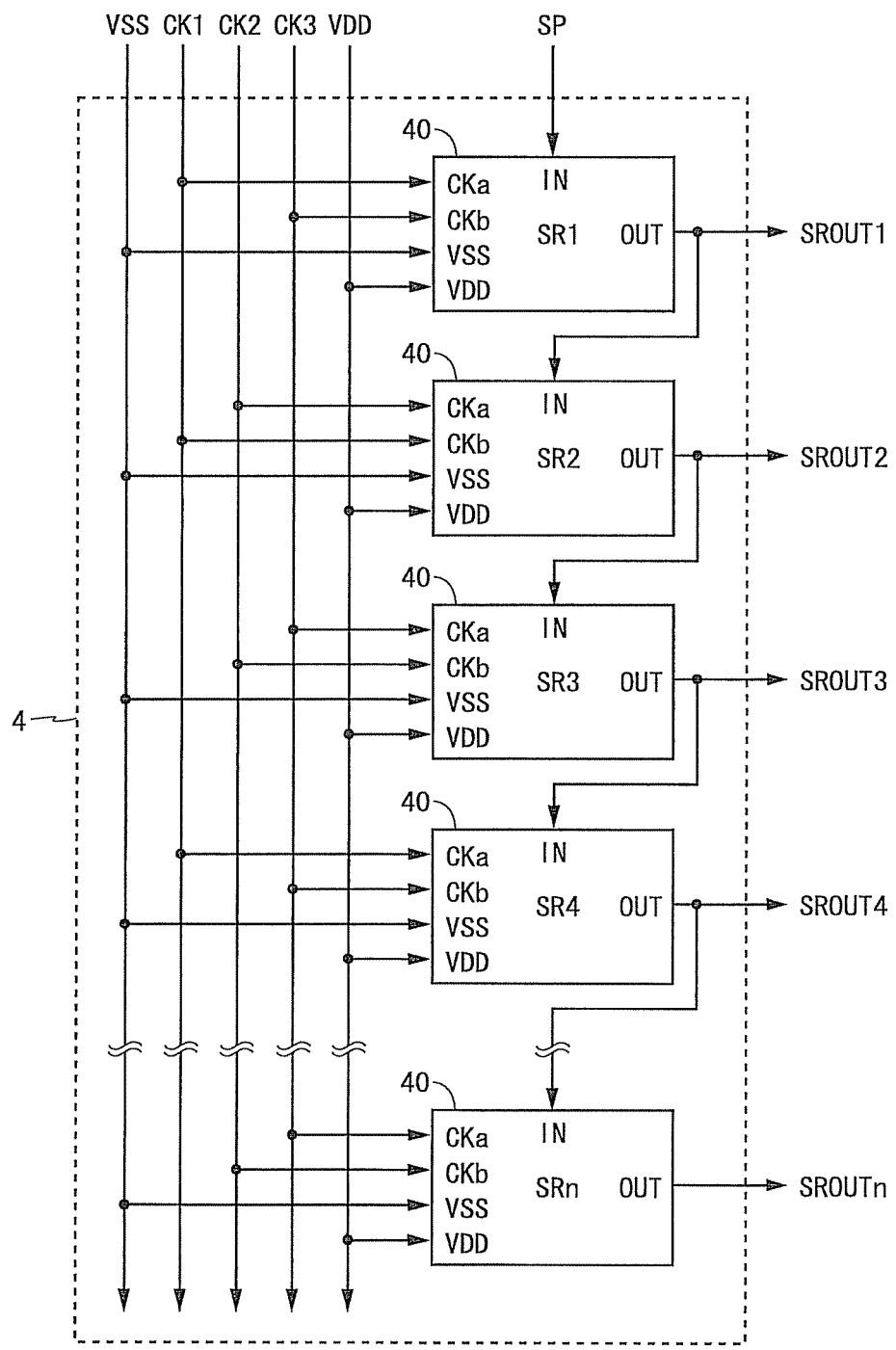
FIG. 12 is a block diagram illustrating a structure of a shift register according to a fourth embodiment of the present invention.

FIG. 12 is a block diagram illustrating a structure of a shift register according to a fourth embodiment of the present invention. A shift register 4 shown in FIG. 12 is configured by cascade connecting n unit circuits 40. Each unit circuit 40 has an input terminal IN, clock terminals CKa and CKb, power source terminals VDD and VSS, and an output terminal OUT. The n unit circuits 40 are divided into three groups: a first group including first stage, fourth stage, seventh stage, and the like circuits, a second group including second stage, fifth stage, eighth stage, and the like circuits, and a third group including third stage, sixth stage, ninth stage, and the like circuits.

To the shift register 4, a start pulse SP, clock signals CK1 to CK3 of three phases, a high-level potential VDD, and a low-level potential VSS are externally supplied. The start pulse SP is fed to the input terminal IN of a first stage unit circuit 40. The clock signal CK1 is fed to the clock terminals CKa of the unit circuits 40 in the first group, and the clock terminals CKb of the unit circuits 40 in the second group. The clock signal CK2 is fed to the clock terminals CKa of the unit circuits 40 in the second group and the clock terminals CKb of the unit circuits 40 in the third group. The clock signal CK3 is fed to the clock terminals CKa of the unit circuits 40 in the third group and the clock terminals CKb of the unit circuits 40 in the first group. The high-level potential VDD is fed to the power source terminals VDD of all of the unit circuits 40. The low-level potential VSS is fed to the power source terminals VSS of all of the unit circuits 40. An output signal OUT from the unit circuit 40 is externally outputted as output signals SROUT1 to SROUTn, and fed to the input terminal IN of a next stage unit circuit 40.

Figure 13:
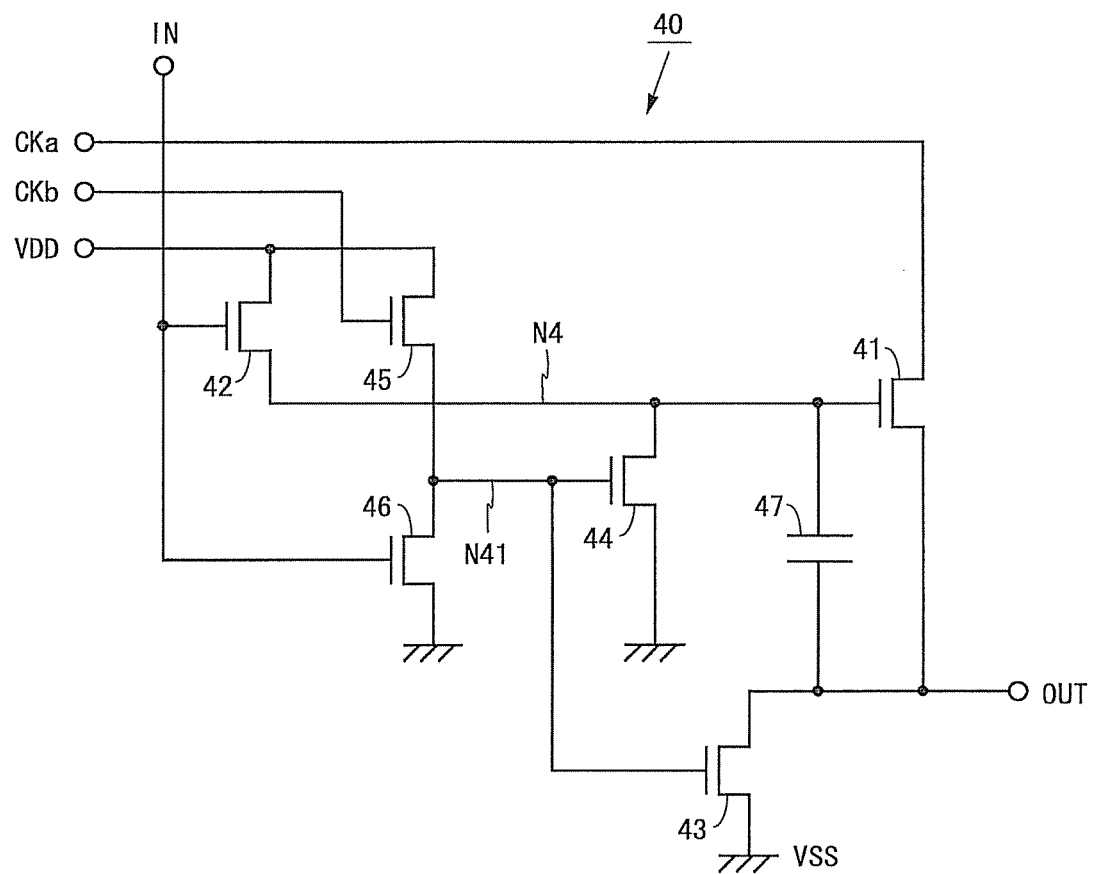
FIG. 13 is a circuit diagram of a unit circuit included in the shift register shown in FIG. 12.

FIG. 13 is a circuit diagram of the unit circuit 40 included in the shift register 4. A circuit structure of the unit circuit 40 is the same as that described in Patent Document 2. Here, FIG. 13 explicitly shows a capacitor that is not explicitly described in Patent Document 2. The unit circuit 40 is different from the circuit described in Patent Document 2 in that the unit circuit 40 has the same characteristic as in the first embodiment in the sizes of the transistors.

As shown in FIG. 13, each unit circuit 40 includes N-channel type transistors 41 to 46 and a capacitor 47. A drain of the transistor 41 is connected to the clock terminal CKa, and a source of the transistor 41 is connected to the output terminal OUT. A drain of the transistor 42 is connected to the power source terminal VDD, a gate of the transistor 42 is connected to the input terminal IN, and a source of the transistor 42 is connected to a gate of the transistor 41. The capacitor 47 is provided between the gate and the source of the transistor 41.

A drain of the transistor 43 is connected to the output terminal OUT, and a drain of the transistor 44 is connected to the gate of the transistor 41. Gates of the transistors 43 and 44 are connected to each other, and sources of the transistors 43 and 44 are connected to the power source terminal VSS. A drain of the transistor 45 is connected to the power source terminal VDD, a gate of the transistor 45 is connected to the clock terminal CKb, and a gate of the transistor 45 is connected to the gates of the transistors 43 and 44. A drain of the transistor 46 is connected to the gates of the transistors 43 and 44, a gate of the transistor 46 is connected to the input terminal IN, and a source of the transistor 46 is connected to the power source terminal VSS. The transistor 41 is provided between the clock terminal and the output terminal, and functions as an output transistor configured to switch between passing and blocking of a clock signal according to a gate potential. Further, the gate of the transistor 41 is capacitively coupled with a conduction terminal of the transistor 41 on a side of the output terminal OUT (the source). Therefore, in the clock passing period during which the transistor 41 is in an ON state and the clock signal CKa is high level, the gate potential of the transistor 41 becomes higher than a high-level potential of the clock signal CKa. Hereinafter, a node to which the gate of the transistor 41 is connected is referred to as N4, and a node to which the gates of the transistors 43 and 44 are connected is referred to as N41.

Figure 14:
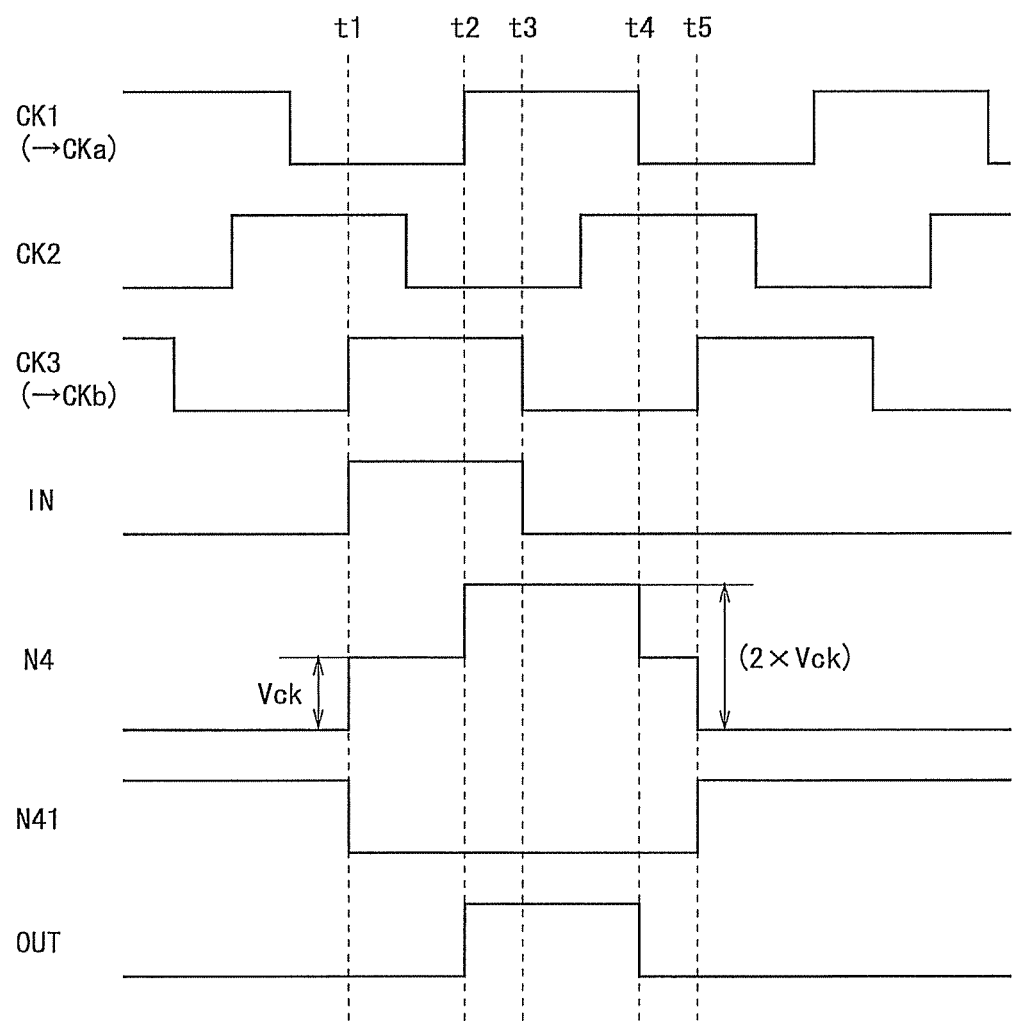
FIG. 14 is a timing chart of the shift register shown in FIG. 12.

FIG. 14 is a timing chart of the shift register 4. FIG. 14 shows changes of input signals, output signals and potentials of the nodes N4 and N41 of a unit circuit 40 in the first group. To the unit circuit 40 in the first group, the clock signal CK1 is fed through the clock terminal CKa, and the clock signal CK3 is fed through the clock terminal CKb. The clock signal CK1 is a clock signal whose length in a high level period substantially equals to ½ cycle. The clock signal CK2 is a clock signal that is delayed by ⅓ cycle from the clock signal CK1. The clock signal CK3 is a clock signal that is delayed by ⅔ cycle from the clock signal CK1.

At time t1, when a clock signal CKb (the clock signal CK3) and an input signal IN (an output signal from the previous stage unit circuit 40) change from low level to high level, the transistors 42, 45, and 46 are turned to the ON state. At this time, the potential of the node N4 becomes high level, and the transistor 41 is turned to the ON state. Further, as a size of the transistor 46 is sufficiently larger than a size of the transistor 45, the potential of the node N41 becomes low level. Therefore, the transistors 43 and 44 are turned to the OFF state.

At time t2, when the clock signal CKa (the clock signal CK1) changes from low level to high level, the potential of the node N4 increases up to about (2×Vck) due to a bootstrap effect. As the gate potential of the transistor 41 is sufficiently high, the clock signal CKa passes through the transistor 41 without causing a voltage drop. In a time period from the time t2 to the time t4 during which the clock signal CKa is high level, the potential of the node N4 is about (2×Vck), and the output signal OUT becomes high level. At the time t4, the potential of the node N4 becomes high level, and the output signal OUT becomes low level.

It should be noted that, at time t3, the clock signal CKb and the input signal IN change to low level, and the transistors 42, 45, and 46 are turned to the OFF state. At this time, the nodes N4 and N41 become in a floating state, but the potentials of the nodes N1 and N41 do not change, and therefore the states of the transistors 41, 43, and 44 do not change.

At time t5, when the clock signal CKb changes to high level, the transistor 45 is turned to the ON state. At this time, as the input signal IN is low level and the transistor 46 is in the OFF state, the potential of the node N41 becomes high level. Therefore, the transistors 43 and 44 are turned to the ON state. While the transistor 43 is in the ON state, a low-level potential is applied to the output terminal OUT. Further, when the transistor 44 is turned to the ON state, the potential of the node N4 changes to low level and the transistor 41 is turned to the OFF state. Until the input signal IN becomes high level next time, the transistor 41 keeps the OFF state and the output signal OUT remains at low level. The shift register 4 is used in a similar manner as the shift register 1 according to the first embodiment.

The node N4 in the unit circuit 40 is connected with, in addition to the transistor 41, the transistors 42 and 44. Among these, the transistor 44 is turned to the OFF state in the clock passing period as a low-level potential is fed to the gate of this transistor. Further, a low-level potential is fixedly applied to the sources of the transistor 44. In the unit circuit 40, it is possible to prevent dullness in the output signal OUT from occurring by making the channel length of the transistor 44 longer than the channel length of the transistor 41.

Fifth Embodiment

Figure 15:
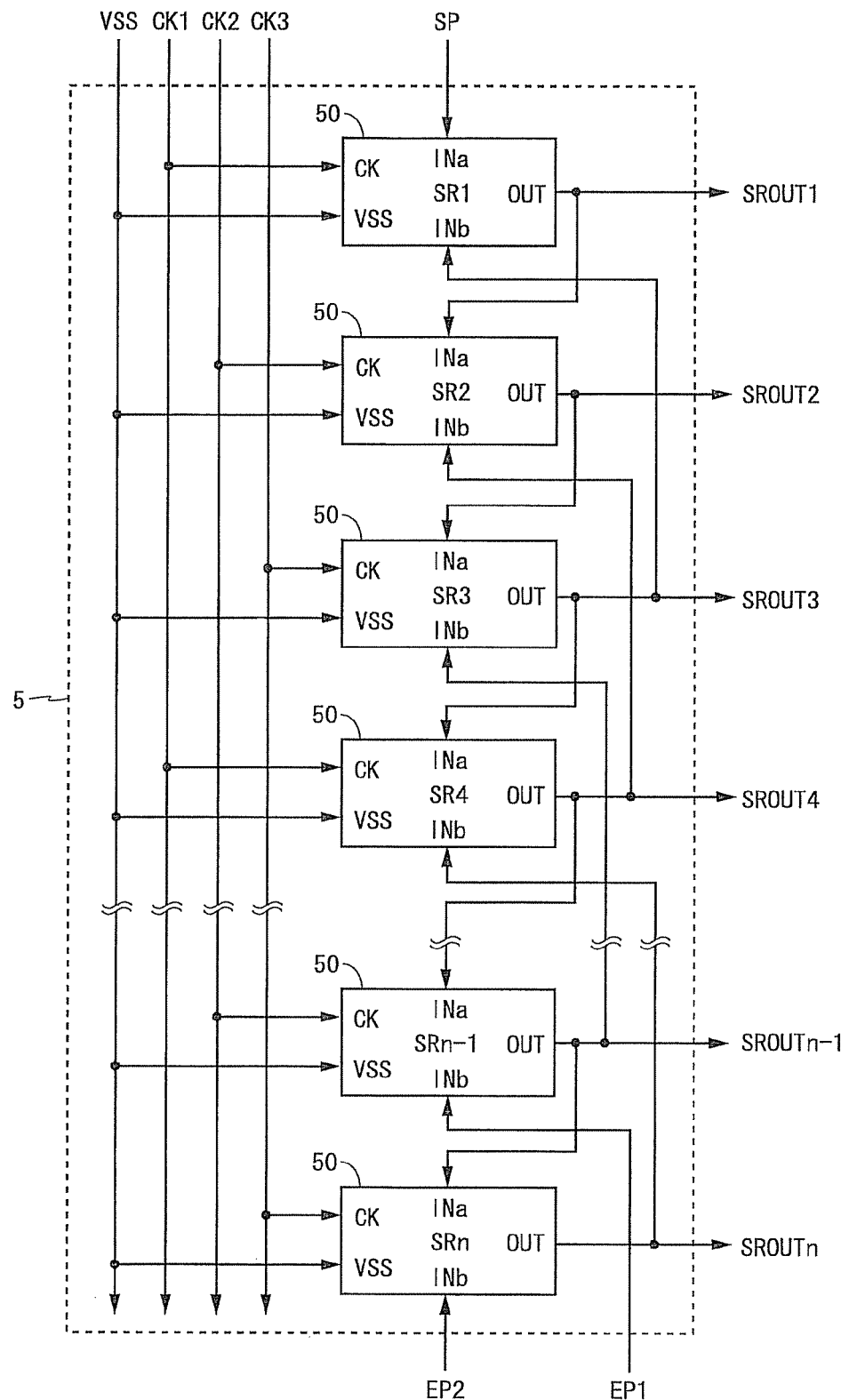
FIG. 15 is a block diagram illustrating a structure of a shift register according to a fifth embodiment of the present invention.

FIG. 15 is a block diagram illustrating a structure of a shift register according to a fifth embodiment of the present invention. A shift register 5 shown in FIG. 15 is configured by cascade connecting n unit circuits 50. Each unit circuit 50 has input terminals INa and INb, a clock terminal CK, a power source terminal VSS, and an output terminal OUT. The n unit circuits 50 are divided into three groups similarly to the fourth embodiment.

To the shift register 5, a start pulse SP, end pulses EP1 and EP2, clock signals CK1 to CK3 of three phases, and a low-level potential VSS are externally supplied. The start pulse SP is fed to the input terminal INa of a first stage unit circuit 50. The end pulse EP1 is fed to the input terminal INb of an (n−1)-th stage unit circuit 50. The end pulse EP2 is fed to the input terminal INb of an n-th stage unit circuit 50. The clock signals CK1 to CK3 are fed to the clock terminals CK of the unit circuits 50 in the first to the third groups, respectively. The low-level potential VSS is fed to the power source terminals VSS of all of the unit circuits 50. An output signal OUT from the unit circuit 50 is externally outputted as output signals SROUT1 to SROUTn, and fed to the input terminal INa of a next stage unit circuit 50 and the input terminal INb of a second-previous unit circuit 50.

Figure 16:
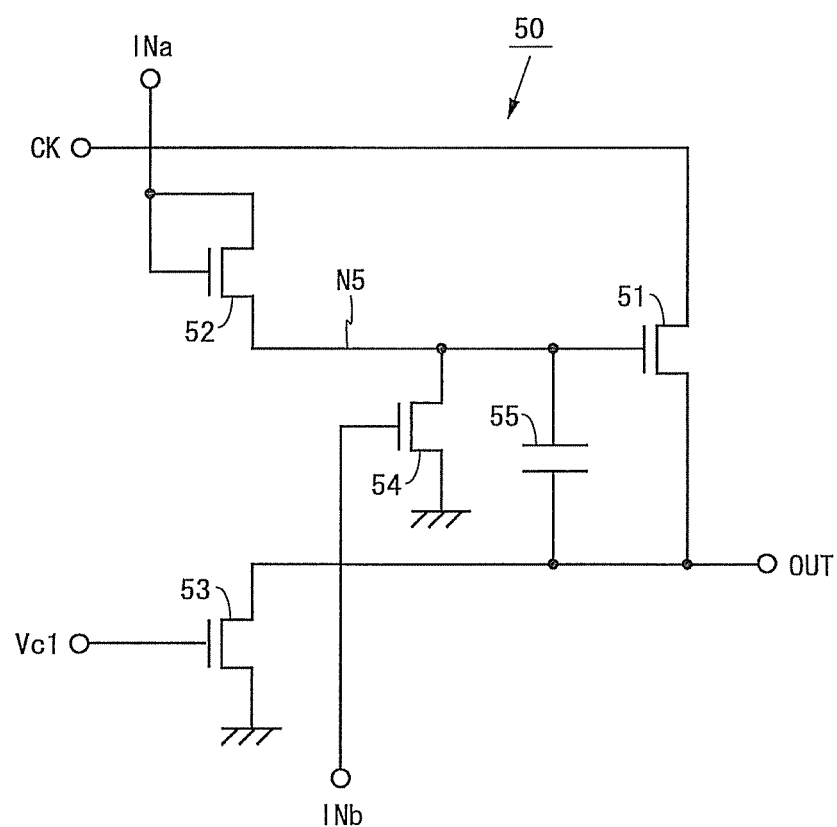
FIG. 16 is a circuit diagram of a unit circuit included in the shift register shown in FIG. 15.

FIG. 16 is a circuit diagram of the unit circuit 50 included in the shift register 5. A circuit structure of the unit circuit 50 is the same as that described in Patent Document 3. The unit circuit 50 is different from the circuit described in Patent Document 3 in that the unit circuit 50 has the same characteristic as in the first embodiment in the sizes of the transistors.

As shown in FIG. 16, the unit circuit 50 includes N-channel type transistors 51 to 54 and a capacitor 55. A drain of the transistor 51 is connected to the clock terminal CK, and a source of the transistor 51 is connected to the output terminal OUT. A drain and a gate of the transistor 52 are connected to the input terminal INa, and a source of the transistor 52 is connected to a gate of the transistor 51. The capacitor 55 is provided between the gate and the source of the transistor 51. A drain of the transistor 53 is connected to the output terminal OUT, a predetermined voltage Vc1 is applied to a gate of the transistor 53, and a source of the transistor 53 is connected to the power source terminal VSS. The voltage Vc1 is a voltage to turn the transistor 53 to the ON state. The transistor 53 functions as a pull-down transistor configured to continuously apply a low-level potential to the output terminal OUT. A drain of the transistor 54 is connected to the gate of the transistor 51, a gate of the transistor 54 is connected to the input terminal INb, and a source of the transistor 54 is connected to the power source terminal VSS.

The transistor 51 is provided between the clock terminal and the output terminal, and functions as an output transistor configured to switch between passing and blocking of a clock signal according to a gate potential. Further, the gate of the transistor 51 is capacitively coupled with a conduction terminal of the transistor 51 on a side of the output terminal OUT (the source). Therefore, in the clock passing period during which the transistor 51 is in an ON state and the clock signal CK is high level, the gate potential of the transistor 51 becomes higher than a high-level potential of the clock signal CK. Hereinafter, a node to which the gate of the transistor 51 is connected is referred to as N5.

Figure 17:
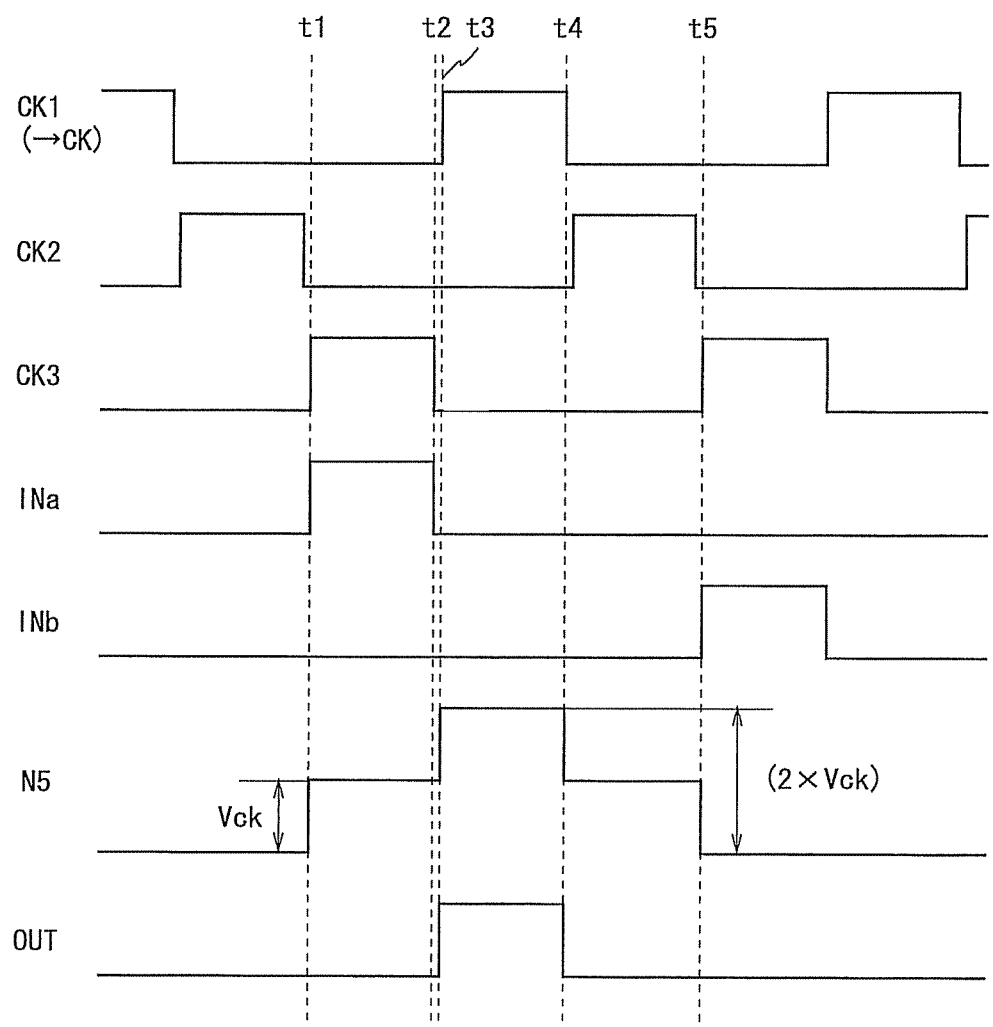
FIG. 17 is a timing chart of the shift register shown in FIG. 15.
Figure 18:
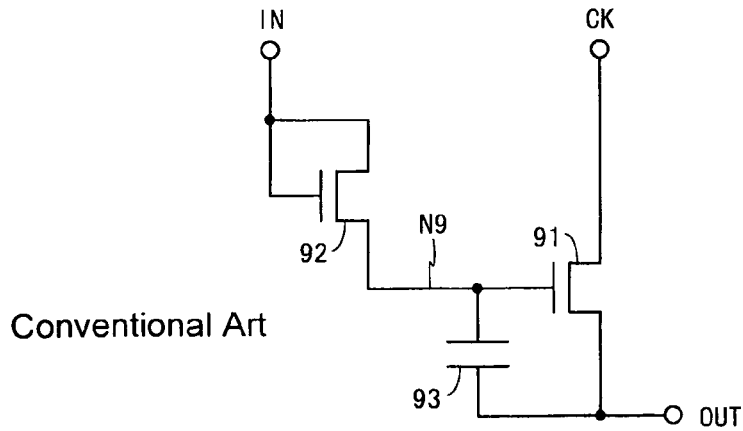
FIG. 18 is a circuit diagram of a bootstrap circuit.

FIG. 17 is a timing chart of the shift register 5. FIG. 17 shows changes of input signals, output signals and a potential of the node N5 of a unit circuit 50 in the first group. To the unit circuit 50 in the first group, the clock signal CK1 is fed through the clock terminal CK. As shown in FIG. 17, the clock signal CK1 is a clock signal whose length in a high level period is slightly shorter than ⅓ cycle. The clock signal CK2 is a clock signal that is delayed by ⅓ cycle from the clock signal CK1. The clock signal CK3 is a clock signal that is delayed by ⅔ cycle from the clock signal CK1.

At time t1, when an input signal INa (an output signal from a previous stage unit circuit 50) changes from low level to high level, the potential of the node N5 also changes to high level via the transistor 52 that is diode connected, turning the transistor 51 to the ON state. At time t2, when the input signal INa changes to low level, the transistor 52 is turned to an OFF state and the node N5 becomes in a floating state, but the transistor 51 keeps the ON state.

At time t3, when the clock signal CK (the clock signal CK1) changes from low level to high level, the potential of the node N5 increases up to about (2×Vck) due to a bootstrap effect. As the gate potential of the transistor 51 is sufficiently high, the clock signal CK passes through the transistor 51 without causing a voltage drop. In a time period from the time t3 to time t4 during which the clock signal CK is high level, the potential of the node N5 is about (2×Vck), and the output signal OUT becomes high level. At the time t4, the potential of the node N5 becomes high level, and the output signal OUT becomes low level.

At time t5, when an input signal INb (an output signal from a second-next unit circuit 50) changes from low level to high level, the transistor 54 is turned to the ON state. At this time, the potential of the node N5 changes to low level and the transistor 51 is turned to the OFF state. Until the input signal INa becomes high level next time, the transistor 51 keeps the OFF state and the output signal OUT remains at low level. The shift register 5 is used in a similar manner as the shift register 1 according to the first embodiment.

The node N5 in the unit circuit 50 is connected with, in addition to the transistor 51, the transistors 52 and 54. The transistors 52 and 54 are turned to the OFF state in the clock passing period as a low-level potential is fed to the gates of these transistors. Further, the input signal INa that is low level in the clock passing period is applied to the drain of the transistor 52, a low-level potential is fixedly applied to the source of the transistor 54. In the unit circuit 50, it is possible to prevent dullness in the output signal OUT from occurring by making the channel lengths of the transistors 52 and 54 longer than the channel length of the transistor 51.

In the above description, in a case in which control transistors whose one conduction terminal of each transistor is connected to a gate of an output transistor includes a plurality of transistors configured such that a low-level potential is fed to a gate of the corresponding transistor to turn the transistor to the OFF state in the clock passing period and that a low-level potential is applied to the other conduction terminal in the clock passing period, the channel lengths of the plurality of transistors are made longer than the channel length of the output transistor. With this, it is possible to effectively prevent dullness in an output signal from occurring. Alternatively, in a case in which a plurality of transistors satisfying the above condition are included in one unit circuit, it is possible to make the channel length only of a part of these transistors longer than the channel length of the output transistor. For example, among the plurality of transistors satisfying the above condition, it is possible to make the channel length only of a transistor having a maximum leakage current longer than the channel length of the output transistor.

Further, while the unit circuit is provided with a capacitor as a bootstrap circuit in the above description, it is possible to use a parasitic capacitance between a gate and a source of an output transistor as a capacitor for bootstrapping.

As described above, according to the shift register of the present invention, by increasing the channel length of the control transistor connected to the gate of the output transistor, it is possible to reduce a leakage current flowing through the control transistor in the clock passing period, and to prevent fluctuation of the gate potential of the output transistor and dullness in an output signal from occurring.

INDUSTRIAL APPLICABILITY

A shift register according to the present invention provides an effect of preventing dullness in an output signal from occurring, and therefore can be used in such as a drive circuit for a display device (a liquid crystal display device, for example).

DESCRIPTION OF REFERENCE NUMERALS

1, 2, 3, 4, 5: Shift Register
10, 20, 30, 40, 50: Unit Circuit
11 to 15, 21, 22, 31 to 34, 41 to 46, 51 to 54: Transistor
16, 47, 55: Capacitor
100: Liquid Crystal Display Device
101: Pixel Array
102: Display Control Circuit
103: Scanning Signal Line Drive Circuit
104: Data Signal Line Drive Circuit

The invention claimed is:
1. A shift register comprising:
unit circuits in cascade connection,
each unit circuit including,
   an output transistor provided between a clock terminal and an output terminal, the output transistor configured to switch between passing and blocking of a clock signal, provided to the clock terminal, according to a gate potential applied to a gate of the output transistor; and
   one or more control transistors each having a first conduction terminal, a second conduction terminal and a gate, the first conduction terminal of each control transistor being connected to the gate of the output transistor, the one or more control transistors including a first control transistor configured to reduce a leakage current during a clock passing period in which the output transistor is in an ON state and the clock signal has a high level potential, wherein
during the clock passing period,
   the gate potential of the output transistor is higher than the high-level potential of the clock signal,
   a low-level potential is applied to the gate of the first control transistor to turn the first control transistor to an OFF state, and
   a low-level potential is applied to the second conduction terminal of the first control transistor; and
the first control transistor has a channel length that is longer than a channel length of the output transistor.
2. The shift register according to claim 1, wherein a low-level potential is fixedly applied to the second conduction terminal of the first control transistor.

3. The shift register according to claim 1, wherein
the second conduction terminal of the first control transistor is configured to receive a signal that becomes low level in the clock passing period.

4. The shift register according to claim 1, wherein the shift register includes more than one of the first control transistor as a plurality of first control transistors and the plurality of first control transistors each have a same configuration as the first control transistor.

5. The shift register according to claim 1, wherein
the channel length of the first control transistor is longer than the channel length of the output transistor by at least 0.5 μm.

6. The shift register according to claim 1, wherein
the gate of the output transistor is capacitively coupled with a conduction terminal of the output transistor on a side of the output terminal.

7. A display device comprising:
a plurality of pixel circuits arranged two-dimensionally; and
a drive circuit including a shift register according to claim 1.

8. A display device comprising:
a plurality of pixel circuits arranged two-dimensionally; and
a drive circuit including a shift register according to claim 2.

9. A display device comprising:
a plurality of pixel circuits arranged two-dimensionally; and
a drive circuit including a shift register according to claim 3.

10. A display device comprising:
a plurality of pixel circuits arranged two-dimensionally; and
a drive circuit including a shift register according to claim 4.

11. A display device comprising:
a plurality of pixel circuits arranged two-dimensionally; and
a drive circuit including a shift register according to claim 5.

12. A display device comprising:
a plurality of pixel circuits arranged two-dimensionally; and
a drive circuit including a shift register according to claim 6.

13. The shift register according to claim 1, wherein
the second conduction terminal of the first control transistor is connected to an output terminal of a previous stage unit circuit.

14. The shift register according to claim 1, wherein
the first control transistor includes a plurality of the first control transistors.

15. A display device comprising:
a plurality of pixel circuits arranged two-dimensionally; and
a drive circuit including a shift register according to claim 13.

16. A display device comprising:
a plurality of pixel circuits arranged two-dimensionally; and
a drive circuit including a shift register according to claim 14.

* * * * *